(12) United States Patent
Kawamoto (10) Patent No.: US 8,757,130 B2
(45) Date of Patent: Jun. 24, 2014

(54) MULTI-LAYER PIEZOELECTRIC ELEMENT, INJECTION DEVICE, AND FUEL INJECTION SYSTEM

(75) Inventor: Tomohiro Kawamoto, Kirishima (JP)

(73) Assignee: Kyocera Corporation, Kyoto (JP)

( * ) Notice: Subject to any disclaimer, the term of this patent is extended or adjusted under 35 U.S.C. 154(b) by 787 days.

(21) Appl. No.: 13/061,486

(22) PCT Filed: Aug. 26, 2009

(86) PCT No.: PCT/JP2009/064837
§ 371 (c)(1),
(2), (4) Date: Apr. 15, 2011

(87) PCT Pub. No.: WO2010/024277
PCT Pub. Date: Mar. 4, 2010

(65) Prior Publication Data
US 2011/0180623 A1    Jul. 28, 2011

(30) Foreign Application Priority Data

Aug. 28, 2008    (JP) ................. 2008-219240

(51) Int. Cl.
*H01L 41/08* (2006.01)
*H01L 41/083* (2006.01)
*F02M 51/06* (2006.01)

(52) U.S. Cl.
USPC ............................ 123/445; 123/498; 310/366

(58) Field of Classification Search
USPC .......... 123/445, 490, 498, 456; 310/365–367, 310/357, 311, 328; 239/102.1, 102.2, 585.1
See application file for complete search history.

(56) References Cited

U.S. PATENT DOCUMENTS

| 5,221,872 | A | 6/1993 | Nishida et al. |
| 5,994,822 | A | 11/1999 | Kondo et al. ................ 310/358 |
| 6,194,818 | B1 | 2/2001 | Sumi et al. .................... 310/800 |
| 8,104,693 | B2 * | 1/2012 | Ono ........................... 239/102.2 |
| 8,405,287 | B2 * | 3/2013 | Okamura ...................... 310/366 |
| 8,578,911 | B2 * | 11/2013 | Nakamura .................... 310/365 |

(Continued)

FOREIGN PATENT DOCUMENTS

| CN | 1083336 C | 4/2002 |
| EP | 0932209 A2 | 7/1999 |

(Continued)

OTHER PUBLICATIONS

Jones et al., "Domain texture distributions in tetragonal lead zirconate titanate by x-ray and neutron diffraction" Journal of Applied Physics, vol. 97, No. 3, pp. 34113-1 through 34113-6, Jan. 19, 2005.

(Continued)

*Primary Examiner* — Hieu T Vo
(74) *Attorney, Agent, or Firm* — DLA Piper LLP (US)

(57) ABSTRACT

Provided is a multi-layer piezoelectric element capable of achieving a high response speed and an increase in the displacement amount, ensuring sufficient mechanical strength, and suppressing deterioration of characteristics. A multi-layer piezoelectric element includes a stacked body in which piezoelectric layers and internal electrode layers are alternately laminated, and the piezoelectric layers include a polarization domain extending over a plurality of crystal particles. Since the piezoelectric layers include the polarization domain extending over the plurality of crystal particles, the multi-layer piezoelectric element can achieve a high response speed and an increase in the displacement amount, ensure sufficient mechanical strength, and suppress deterioration of characteristics.

9 Claims, 4 Drawing Sheets

(56) References Cited

U.S. PATENT DOCUMENTS

| | | |
|---|---|---|
| 2007/0108876 A1 | 5/2007 | Ogawa |
| 2007/0125977 A1 | 6/2007 | Kawamoto et al. |
| 2007/0155613 A1 | 7/2007 | Ito et al. ........................ 501/137 |
| 2008/0036334 A1 | 2/2008 | Kawada et al. |
| 2008/0211880 A1 | 9/2008 | Hara et al. ...................... 347/70 |
| 2010/0072306 A1 | 3/2010 | Ono |

FOREIGN PATENT DOCUMENTS

| | | |
|---|---|---|
| JP | 58054689 A | 3/1983 |
| JP | 63102384 A | 5/1988 |
| JP | 10-335713 | 12/1998 |
| JP | 11-214763 | 8/1999 |
| JP | 2000-214065 | 8/2000 |
| JP | 2004-221411 | 8/2004 |
| JP | 2005123554 A | 5/2005 |
| JP | 2005-191397 A | 7/2005 |
| JP | 2005179161 A | 7/2005 |
| JP | 2007-153631 | 6/2007 |
| JP | 2008-218620 | 9/2008 |
| WO | 2008038683 A1 | 4/2008 |

OTHER PUBLICATIONS

Extended European search report dated Apr. 26, 2013 issued in corresponding European application 09809928.6.

* cited by examiner

FIG. 4

MULTI-LAYER PIEZOELECTRIC ELEMENT, INJECTION DEVICE, AND FUEL INJECTION SYSTEM

CROSS-REFERENCE TO THE RELATED APPLICATIONS

This application is a national stage of international application No. PCT/JP2009/064837, filed on Aug. 26, 2009, and claims the benefit of priority under 35 USC 119 to Japanese Patent Application No. 2008-219240, filed on Aug. 28, 2008, the entire contents of which are incorporated herein by reference.

TECHNICAL FIELD

The present invention relates to a multi-layer piezoelectric element, an injection device using the same, and a fuel injection system. The multi-layer piezoelectric element of the invention is used for, for example, a driving element (piezoelectric actuator), a sensor element, and a circuit element. Examples of the driving element include a fuel injection device of an automobile engine, a fluid injection device like an ink jet, a precision positioning device like an optical device, and a vibration prevention device. Additionally, examples of the sensor element include a combustion pressure sensor, a knocking sensor, an acceleration sensor, a load sensor, an ultrasonic sensor, a pressure-sensitive sensor, and a yaw rate sensor. Examples of the circuit element include a piezoelectric gyroscope, a piezoelectric switch, a piezoelectric transformer, and a piezoelectric breaker.

BACKGROUND ART

A multi-layer piezoelectric element including a stacked body in which a plurality of piezoelectric layers are laminated with internal electrode layers interposed therebetween, a pair of external electrodes being formed on side faces of the stacked body, has conventionally been known. This multi-layer piezoelectric element has a structure in which an external electrode with positive polarity and an external electrode with negative polarity are respectively formed on facing side faces of the stacked body, and the internal electrode layers are electrically connected to the external electrodes alternately. By applying a voltage to the piezoelectric layers between the internal electrode layers via the external electrodes, displacement is obtained in a stacked direction thereof. The key factor of this displacement corresponds to movement of a domain wall which is present in crystal particles of the piezoelectric layers which constitute a stacked body. It is known that the movement of this domain wall is constrained by a particle boundary between crystal particles (see Patent Literature 1).

CITATION LIST

Patent Literature

Patent Literature 1: Japanese Unexamined Patent Publication JP-A 2005-191397

DISCLOSURE OF INVENTION

Technical Problem

In the above multi-layer piezoelectric element, there is a problem that the movement of the domain wall is constrained by the particle boundary of a piezoelectric layer, and the response speed becomes slow. Additionally, there is a problem that the amount of displacement of the multi-layer piezoelectric element decreases in response to constraint of the movement of the domain wall by the particle boundary of the piezoelectric layer. Moreover, in order to reduce the particle boundary of the piezoelectric layer, crystal particles may be enlarged. However, in a case where the crystal particles of the piezoelectric layer are large, the mechanical strength of piezoelectric ceramics decreases. Therefore, there is a problem that cracks are generated in the piezoelectric layers which are piezoelectric ceramics which constitute the multi-layer piezoelectric element due to continuous driving, and the amount of displacement gradually decreases.

The invention has been devised in order to solve such problems, and an object of the invention is to provide a multi-layer piezoelectric element in which movement of a domain wall is hard to be constrained and which can achieves a high response speed and an increase in the displacement amount, ensure sufficient mechanical strength, and suppress deterioration of characteristics.

Solution to Problem

A multi-layer piezoelectric element of the invention comprises a stacked body in which piezoelectric layers and internal electrode layers are alternately laminated, and the piezoelectric layers comprise a polarization domain extending over a plurality of crystal particles.

Furthermore, as to the multi-layer piezoelectric element of the invention, in the above configuration, it is preferable that the polarization domain extends over the plurality of crystal particles with the plurality of crystal particles located therein.

Furthermore, as to the multi-layer piezoelectric element of the invention, in the above respective configurations, it is preferable that a direction of spontaneous polarization of the polarization domain is deviated from an electric field direction of a voltage applied between the internal electrode layers.

Furthermore, as to the multi-layer piezoelectric element of the invention, in the above respective configurations, it is preferable that an average particle size of the plurality of crystal particles of the piezoelectric layers is 5 μm or less.

Furthermore, as to the multi-layer piezoelectric element of the invention, in the above respective configurations, it is preferable that the polarization domain of the piezoelectric layers is located in a vicinity of an end of the internal electrode layers.

Furthermore, as to the multi-layer piezoelectric element of the invention, in the above respective configurations, it is preferable that the polarization domain is formed in some of the piezoelectric layers.

Furthermore, as to the multi-layer piezoelectric element of the invention, in the above respective configurations, it is preferable that the polarization domain is formed in all of the piezoelectric layers.

An injection device of the invention comprises a container comprising an injection nozzle; and any one of the multi-layer piezoelectric elements mentioned above, and a liquid stored in the container is configured to be injected through the injection nozzle by driving the multi-layer piezoelectric element.

A fuel injection system of the invention comprises a common rail configured to store high-pressure fuel; the injection device mentioned above configured to inject the high-pressure fuel stored in the common rail; a pressure pump configured to supply the high-pressure fuel to the common rail; and an injection control unit configured to send a driving signal to the injection device.

Advantageous Effects of Invention

According to the multi-layer piezoelectric element of the invention, since the piezoelectric layers comprise the polarization domain extending over a plurality of crystal particles, movement of a domain wall between polarization domains is hard to be constrained at a particle boundary between crystal particles. Therefore, the constraint of the domain wall can be made small and the moving speed and movement amount of the domain wall caused by an electric field can be increased. Thereby, the response speed of the multi-layer piezoelectric element becomes high, and the amount of displacement can be increased. Additionally, the polarization domain which is not limited in crystal particle size is present. Therefore, even if the crystal particle size is kept small, the movement amount of the domain wall can be secured. Thus, the crystal particles of the piezoelectric layers can be made small, and thereby, a multi-layer piezoelectric element with high mechanical strength and a large amount of displacement can be obtained. As a result, generation of cracks of the stacked body caused by continuous driving can be suppressed, and deterioration of characteristics can be kept small.

Furthermore, according to the injection device of the invention, the injection device includes the multi-layer piezoelectric element of the invention serving as a multi-layer piezoelectric element configured to inject a liquid stored within a container through an injection nozzle. Therefore, it is possible to secure a large amount of displacement and excellent durability in the multi-layer piezoelectric element. Thus, desired injection of a liquid can be stably performed for a prolonged period of time.

Moreover, according to the fuel injection system of the invention, the fuel injection system includes the injection device of the invention as a device configured to inject the high-pressure fuel stored into the common rail. Thus, desired injection of high-pressure fuel can be stably performed for a prolonged period of time.

BEST MODE FOR CARRYING OUT THE INVENTION

<Multi-Layer Piezoelectric Element>

Now referring to the drawings, Embodiments of a multi-layer piezoelectric element of the invention will be described below in detail.

Figure 1:
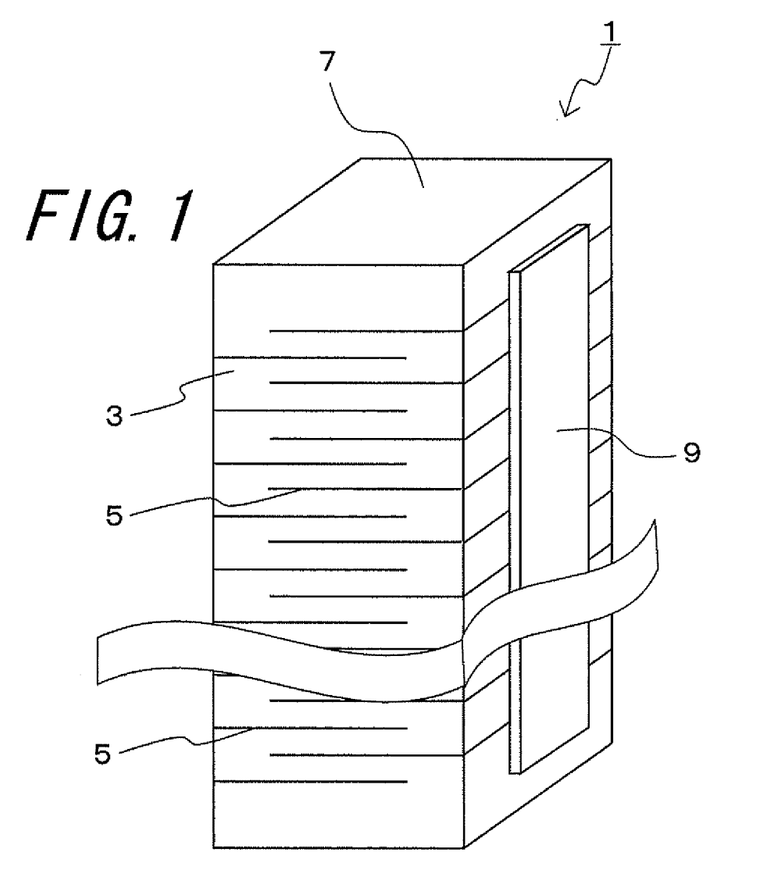
FIG. 1 is a perspective view showing an example of a multi-layer piezoelectric element according to an embodiment of the invention.
Figure 2:
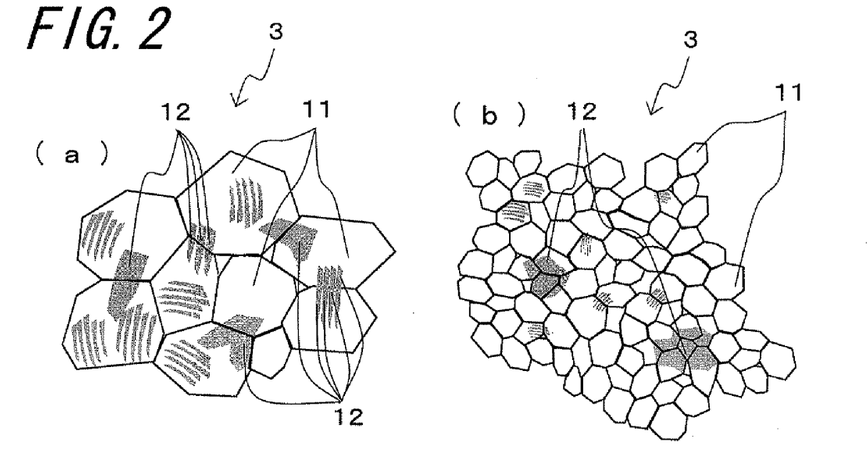
FIGS. 2(a) and 2(b) are schematic views of a polarization domain of a piezoelectric layer which constitutes the multi-layer piezoelectric element shown in FIG. 1, respectively.

FIG. 1 is a perspective view showing an example of a multi-layer piezoelectric element according to an embodiment of the invention, and FIGS. 2(a) and 2(b) are schematic views of a polarization domain of a piezoelectric layer which constitutes the multi-layer piezoelectric element shown in FIG. 1, respectively.

As shown in FIG. 1, the multi-layer piezoelectric element 1 of the present embodiment comprises a stacked body 7 in which piezoelectric layers 3 and internal electrode layers 5 are alternately laminated, and an external electrode 9 which is joined to a side face of the stacked body 7 and is electrically connected to the internal electrode layers 5.

In the multi-layer piezoelectric element 1 of the invention, as shown in FIGS. 2(a) and 2(b), the piezoelectric layers 3 comprise a polarization domain 12 extending over a plurality of crystal particles 11. Such a domain structure is realized by reducing discontinuity such as crystal defects at a particle boundary, residual stress, or a hetero-phase component. Therefore, in the piezoelectric layers 3 having such a domain structure, the force of constraint at the particle boundary of a domain wall decreases, and the moving speed of the domain wall with respect to the electric field applied to the piezoelectric layer 3 becomes high. That is, the response speed of displacement can be made high.

The polarization domain 12 extending over the plurality of crystal particles 11 is formed in a part of the piezoelectric layers 3 located between the internal electrode layers 5. When the size of the polarization domain 12 extending over the plurality of crystal particles 11 is greater than the thickness of a particle boundary layer whose minimum thickness is equal to or less than 1 nm, the size is not be limited to the particle size of the crystal particles 11. Additionally, although the part of the polarization domain 12 which is present over the plurality of crystal particles 11 may be anywhere of the domain which is located between the internal electrode layers 5, it is preferable that the polarization domain is mainly present at a central portion between the internal electrode layers 5 where the influence of stress between the internal electrode layer 5 and a porcelain of the piezoelectric layer 3 decreases.

In addition, the polarization domain 12 extending over such a plurality of crystal particles 11 can be formed by firing the piezoelectric layer 3 at a low temperature. That is, crystal particle groups which are uniform in crystal arrangement are bonded and become one particle at a high firing temperature. In contrast, at a low firing temperature, it is possible to terminate sintering while a plane defect is left in the crystal group which is uniform in crystal arrangement, and a region where spontaneous polarization is uniform between adjacent particles can be created via the plane defect.

At this time, a preferable peak temperature during firing is 850 to 950° C. During temperature lowering, it is preferable to apply a wind to an upper portion of a firing bowl and cool the bowl, from the viewpoint of growing up a polarization domain. That is, by cooling the bowl while sending a wind to the upper portion of the firing bowl, a temperature can be slowly lowered in a state where a temperature gradient is given to the piezoelectric element. Thereby, spontaneous polarization can be generated sequentially from a part of the piezoelectric element which falls below the Curie temperature, and a polarization domain straddled between crystal particles is easily formed.

Moreover, it is preferable that the polarization domain 12, as shown in FIG. 2(b), extends over the plurality of crystal particles 11 with the plurality of crystal particles 11 located therein. Even in this state, a domain structure realized by reducing the discontinuity of a particle boundary is provided. However, in a case where the polarization domain 12 extending over the plurality of crystal particles 11 with the plurality of crystal particles 11 located therein in this way is present, the movement of the domain wall with respect to the electric field applied to the piezoelectric layer 3 becomes larger, and the amount of displacement of the piezoelectric layers 3 can be further increased. In addition, the size of the polarization domain 12 in this case is not particularly limited, and may be a size including the plurality of crystal particles 11.

In order to form the polarization domain 12 extending over such a plurality of crystal particles 11 with the plurality of crystal particles 11 located therein, the piezoelectric layer 3 may be manufactured by low-temperature firing on the basis of fine power PZT (lead zirconate titanate). That is, the polarization domain 12 extending over the plurality of crystal particles 11 with a small crystal particle size can be formed by manufacturing the piezoelectric layer 3 by low-temperature firing on the basis of fine powder PZT. At this time, as a firing temperature, it is preferable that the peak temperature is set to 900° C. or lower.

Additionally, in order to form the polarization domain 12 which straddles the plurality of crystal particles 11, it is necessary to suppress occurrence of discontinuity between the crystal particles 11. In a case where an alloy of silver and palladium is used for an internal electrode, silver tends to selectively enter a particle boundary portion during firing. Low-temperature firing is important also from the viewpoints of reducing the amount of diffusion of the silver from the internal electrode to the particle boundary portion, and suppressing occurrence of discontinuity between the crystal particles 11. Moreover, when PZT in which a lead site is lost is used for the piezoelectric layer 3, there is an effect that the silver diffused from the internal electrode during firing is incorporated into the lead site within a crystal particle. This effect is important in that the amount of the silver which is present at the particle boundary portion is suppressed.

Additionally, it is preferable that a direction of the spontaneous polarization of the polarization domain 12 is deviated from an electric field direction of a voltage applied between the internal electrode layers 5. Most of the displacement of the multi-layer piezoelectric element 1 is developed by aligning the direction of the spontaneous polarization of the polarization domain 12 with the electric field direction of a voltage applied to the piezoelectric layer 3. Accordingly, when the polarization domain 12 where the direction of spontaneous polarization has been deviated from the electric field direction of a voltage to be applied is present, the amount of displacement can be further increased.

In this case, as to the deviation of the direction of spontaneous polarization of the polarization domain 12 from the electric field direction, the direction of the deviation therefrom is not particularly limited, and may be various directions.

In order to form such a polarization domain 12, it is preferable that a crystal phase used for the piezoelectric layer 3 contains a rhombohedral phase at least at a room temperature. In the rhombohedral phase, the crystal orientation which can be a polarization axis is eight directions, compared to the six directions of a tetragonal phase. Thus, as the rhombohedral phase is exposed under a high load before polarization, the direction of spontaneous polarization is easily oriented in a direction perpendicular to the stacked direction, and the crystal orientation between adjacent crystal particles is easily aligned. Moreover, it is preferable that the piezoelectric body of the piezoelectric layer 3 is made of a soft material in which a donor is included in PZT. The reason is that since the soft material allows a domain wall to move easily, deformation of the piezoelectric layer occurs under a high load before polarization, and the orientation of the spontaneous polarization is easily aligned.

Additionally, in order to form the piezoelectric layer so that the direction of the spontaneous polarization of the polarization domain 12 is deviated from the electric field direction of a voltage applied between the internal electrode layers 5, PZT having the Curie temperature higher than a room temperature may be selected as PZT used for the piezoelectric layer 3. At this time, it is preferable that PZT whose Curie temperature is 300° C. or higher is selected from a viewpoint that the polarization domain 12 is stabilized with respect to temperature.

Additionally, it is preferable that an average particle size of the plurality of crystal particles 11 of the piezoelectric layers 3 is 5 μm or less. If the average particle size of the plurality of crystal particles 11 is 5 μm or more, transgranular fracture tends to occur. On the other hand, if the average particle size is 5 μm or less, the fracture mode of the piezoelectric layer 3 by driving tends to become intergranular fracture. As a result, since the porcelain strength of the piezoelectric layers 3 is high, and a crack is hard to grow, deterioration of the displacement caused by continuous driving tends to be almost eliminated. On the other hand, when the average particle size of the plurality of crystal particles 11 is greater than 5 μm, deterioration of characteristics caused by continuous driving tends to increase.

In order to set the average particle size of the plurality of crystal particles 11 of the piezoelectric layers 3 to 5 μm or less, for example, a constituent element ratio (A/B ratio) which is a ratio of a constituent element of an A site and a constituent element of a B site of a PZT porcelain composition which constitutes the piezoelectric layer 3 may be set to 1 or less so as to form the piezoelectric layer 3.

Figure 3:
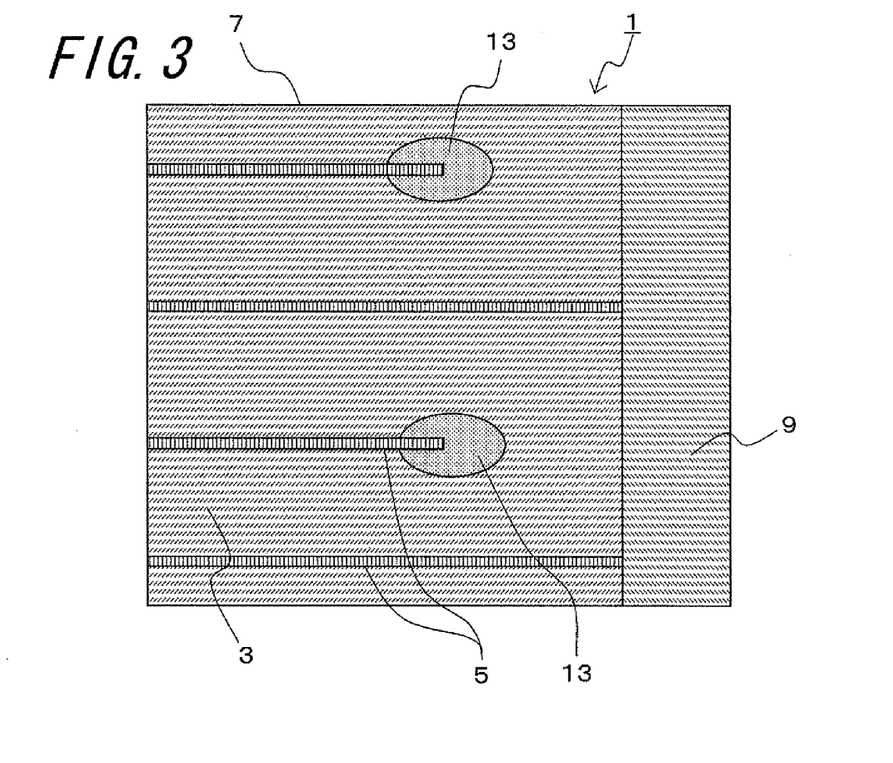
FIG. 3 is an enlarged sectional view of a main part schematically showing an example in the vicinity of the end of internal electrode layers 5 in a stacked body 7 of the multi-layer piezoelectric element 1 shown in FIG. 1.

Additionally, as shown in FIG. 3, it is preferable that the polarization domain 12 of the piezoelectric layers 3 is located in the vicinity 13 of the end of the internal electrode layers 5. In addition, FIG. 3 is an enlarged sectional view of a main part schematically showing an example in the vicinity of the end of the internal electrode layers 5 in the stacked body 7 of the multi-layer piezoelectric element 1 shown in FIG. 1. A part 13 in the vicinity of the end of the internal electrode layers 5 in the stacked body 7 of the multi-layer piezoelectric element 1 is located at the boundary between an active region and an inactive region in the stacked body 7, and when the polarization domain 12 exists in this part, this part 13 becomes softer as compared to the periphery. When the part 13 becomes softer, the constraint to the piezoelectric layers 3 by the inactive region which is located in the vicinity of the end of the internal electrode layer 5 decreases. Therefore, the amount of displacement of the multi-layer piezoelectric element 1 increases. That is, by arranging a region where the polarization domain 12 in which the force of constraint caused by the particle boundary of a domain wall decreases is present, in the vicinity of the end of the internal electrode layers 5, the amount of displacement of the multi-layer piezoelectric layer 1 increases.

Thus, in order to locate the polarization domain 12 of the piezoelectric layers 3 in the part 13 in the vicinity of the end of the internal electrode layers 5, when the stacked body 7 is prepared by printing and laminating the metal paste for the internal electrode layer 5 on a ceramic green sheet, the proportion of Ag in the metal paste of the end of the internal electrode layers 5 to the central portion of the internal electrode layers 5 may be increased.

Additionally, it is preferable that the polarization domain 12 is formed in some of the piezoelectric layers 3. That is, since the piezoelectric layers 3 in which the polarization domain 12 extending over the plurality of crystal particles 11 is present have a large amount of displacement, the amount of displacement can be further increased by arranging some of such piezoelectric layers 3 in the stacked body 7. In order to increase the presence of the polarization domain 12 extending over the plurality of crystal particles 11 in a desired stacked direction, the proportion of silver (Ag) in the internal electrode layer 5 at a position where the presence of the polarization domain 12 is increased may be set to be as high as 95% by mass, and the proportion of silver in the other internal electrode layers 5 may be set to 90% by mass. Particularly, generation of a crack which is easily generated at the end of the stacked body 7 by continuous driving can be suppressed by arranging the internal electrode layers 3 in which the proportion of silver has been changed so that the amount of displacement increases in the piezoelectric layers 3 located at the central portion of the stacked body 7 in the stacked direction and thereby, the amount of displacement decreases in the piezoelectric layers 3 located at the end of the stacked body 7 in the stacked direction.

Additionally, it is preferable that the polarization domain 12 is formed in all of the piezoelectric layers 3. That is, since the piezoelectric layers 3 in which the polarization domain 12 extending over the plurality of crystal particles 11 is present have a large amount of displacement, the amount of displacement of the multi-layer piezoelectric element 1 increases further by forming such a polarization domain 12 in all of the piezoelectric layer 3.

In a case where the polarization domain 12 extending over the plurality of crystal particles 11 is formed in all of the piezoelectric layers 3, the polarization domain may be basically formed by the same method as the aforementioned forming method. That is, in order to reduce the discontinuity of the interface between the crystal particles 11, it is necessary to reduce the residual stress generated at an interface between the internal electrode layer 5 and the porcelain of the piezoelectric layer 3, and to select a metal with a low Young's modulus for the internal electrode layer 5. Thus, in a case where an alloy of Ag and Pd is used, it is preferable that the proportion of Ag is set to 95% by mass or more, and the firing temperature is set to 900° C. or lower. By doing in this way, discontinuity such as crystal defects at a particle boundary, residual stress, or a hetero-phase component, can be reduced, and the polarization domain 12 extending over the plurality of crystal particles 11 can be formed in all of the piezoelectric layers 3.

<Manufacturing Method>

Next, a method for manufacturing the multi-layer piezoelectric element of the invention will be described.

First, powder made mainly of perovskite oxide (Pb(Zr,Ti)$O_3$):PZT) containing lead zirconate titanate (PbZrO$_3$—PbTiO$_3$) as a piezoelectric material, a binder made of an organic polymer such as an acrylics or butyrals, and a plasticizer such as DBP (dibutyl phthalate) and SOP (dioctyl phthalate) are mixed together to prepare a slurry. Next, a ceramic green sheet is prepared from this slurry by using tape molding methods such as a doctor blade method and a calendar roll method.

Here, as the PZT powder, it is preferable to use powder obtained by synthesizing a mixed raw material made of high purity powder at a low temperature of 700° C. or lower by a solid phase technique.

In addition, a piezoelectric ceramic material made mainly of barium titanate BaTiO$_3$ in addition to lead zirconate titanate (PZT) as a piezoelectric material may be used for the piezoelectric layer 3. As this piezoelectric ceramic, it is desirable that a ceramic material having piezoelectric strain constant $d_{33}$ exhibiting high piezoelectric characteristics is used.

Next, a metal paste for the internal electrode layers 5 is prepared. This metal paste is obtained by adding and mixing a binder, a plasticizer, and the like to metal powder made mainly of silver-palladium (Ag—Pd). This metal paste is coated on one side of the ceramic green sheet by screen printing or the like, thereby forming an internal electrode paste layer.

Here, it is preferable that the proportion of Pd in the metal paste be set to 10% by mass or less. Additionally, by using metal pastes whose proportions of Pd are different from each other depending on the position of the internal electrode layer 5 in the stacked body 7, it is possible to obtain a stacked body 7 including the piezoelectric layers 3 having the polarization domain 12 extending over the plurality of crystal particles 11 at a desired position in the stacked body 7. That is, since in the piezoelectric layer 3 around the internal electrode layer 5 using the metal paste whose proportion of Pd has been lowered, the stress between the internal electrode layer 5 and the piezoelectric layer 3 is reduced, and the polarization domain 12 extending over the plurality of crystal particles 11 is easily formed, the proportion of Pd in the metal paste can be changed according to how the polarization domain 12 is formed.

In addition, as the metal powder for the internal electrode layer 5, powder such as copper, palladium, platinum, or nickel in addition to silver palladium may be used.

Next, a stacked compact before firing is obtained by laminating and drying ceramic green sheets on which an internal electrode paste layer has been printed using metal paste so as to have, for example, a structure shown in FIG. 1. At this time, in a case where the thickness of the piezoelectric layer 3 is further needed like in the upper and rear ends of the stacked body 7, ceramic green sheets on which the metal paste is not printed may be partially laminated in a part which needs thickness. Additionally, the stacked compact can be cut with the size of the stacked body 7 as an individual piece, and can be formed in a desired shape. In addition, the thickness of the internal electrode paste layer can be set to about 1 to 40 µm, if screen printing is used, according to the thickness of the internal electrode layer 5.

Next, after the stacked compact has been subjected to binder removal treatment at a predetermined temperature, firing of the stacked compact is performed at 900 to 1000° C. At this time, as for the conditions of a firing temperature profile, the stacked compact is maintained for 25 hours or more in a temperature region of 650° C. or higher after temperature is elevated. In the subsequent temperature lowering process, temperature is lowered over 15 hours or more within a temperature range from 650° C. to 200° C. Next, the obtained sintered compact is formed into the stacked body 7 after being worked with desired dimensions, and external electrodes 9 are formed on side faces of the stacked body. The external electrodes 9 can be formed by preparing metal paste by adding and mixing a binder, a plasticizer, glass powder, and the like to a metal powder made mainly of silver, and printing this metal paste on the side faces of the stacked body 7 by screen printing or the like, and firing the metal paste at a temperature of 600 to 800° C.

Moreover, the external surface of the external electrode 9 may be formed with a conductive auxiliary member made of a conductive adhesive in which a metal mesh or a mesh-like metal plate is buried. In addition, the metal mesh is one formed by knitting a metal wire, and the mesh-like metal plate is one formed with holes in the shape of a mesh in a metal plate.

Thereafter, sheathing resin made of silicone rubber or the like may be coated on the side faces of the stacked body 7 including the external electrode 9, using technique such as dipping, after a lead wire is connected to the external electrode 9 with solder or the like.

In the obtained multi-layer piezoelectric element 1, the piezoelectric layers 3 comprise the polarization domain 12 extending over the plurality of crystal particles 11. In order to obtain a higher effect in the multi-layer piezoelectric element 1 of the invention, as mentioned above, it is preferable that, PZT powder obtained by synthesizing a mixed raw material made of high purity powder at a low temperature of 700° C. or lower by the solid phase technique is used as the PZT powder for forming the piezoelectric layer 3, and a metal paste in which the proportion of Pd is set to 10% by mass or less is used as the metal paste for the internal electrode layer 5. In the firing profile of the stacked body 7, it is also preferable that the peak temperature is within a range of 900° C. to 1000° C., the stacked compact is maintained for 25 hours or more in a temperature region of 650° C. or higher, and temperature is lowered over 15 hours or more within a temperature range from 650° C. to 200° C. in a temperature lowering process.

<Injection Device>

Figure 4:
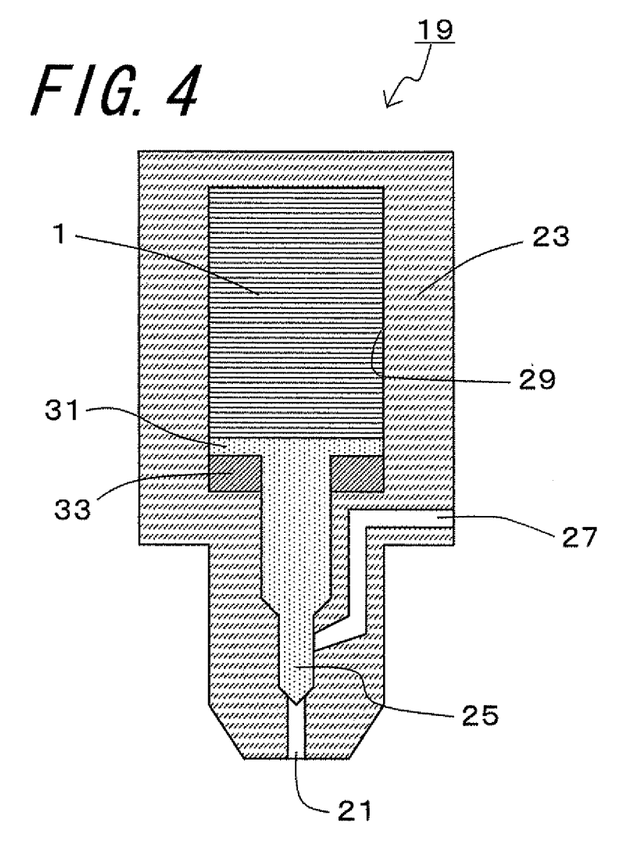
FIG. 4 is a schematic sectional view showing an example of an injection device according to an embodiment of the invention.

FIG. 4 is a schematic sectional view showing an example of an injection device according to an embodiment of the invention. As shown in FIG. 4, the injection device 19 of the present embodiment comprises a housing container (container) 23 having an injection nozzle 21 at one end thereof and the multi-layer piezoelectric element 1 represented by the example of the above embodiment, configured to be housed inside the housing container 23.

A needle valve 25 capable of opening and closing the injection nozzle 21 is disposed within the housing container 23. A fluid passage 27 is disposed in the injection nozzle 21 so as to be capable of communicating with the injection nozzle 21 according to the movement of the needle valve 25. The fluid passage 27 is connected to an external fluid supply source from which a fluid is supplied to the fluid passage 27 always at a high pressure. Accordingly, when the needle valve 25 opens the injection nozzle 21, the fuel which has been supplied to the fluid passage 27 is injected to the outside, for example, a combustion chamber (not shown) of an internal combustion engine or the like, through the injection nozzle 21.

Additionally, the upper end of the needle valve 25 has a larger internal diameter, and has arranged therein a cylinder 29 formed in the housing container 23 and a piston 31 slidable on the cylinder 29. Then, the multi-layer piezoelectric element 1 of the invention as mentioned above is housed in the housing container 23.

In such an injection device 19, when a voltage is applied to the multi-layer piezoelectric element 1 as a piezoelectric actuator, and the multi-layer piezoelectric element expands, the piston 37 is pressed, and the needle valve 25 blocks the injection nozzle 21 to stop the supply of the fluid. Additionally, when the application of a voltage is stopped, the multi-layer piezoelectric element 1 contracts, the dish spring 33 pushes back the piston 31, the fluid passage 27 is opened, and the injection nozzle 21 communicates with the fluid passage 27 so that discharge (injection) of the fuel is performed from (through) the injection nozzle 21.

Additionally, the injection device 19 of the invention includes a container having the injection nozzle 21, and the multi-layer piezoelectric element 1 of the invention, and may be constructed so that a fluid filled into the container is configured to be injected through the injection nozzle 21 by driving the multi-layer piezoelectric element 1. That is, the multi-layer piezoelectric element 1 is not necessarily housed inside the container, and may be constructed so that the pressure for controlling the injection of the fluid is applied to the inside of the container by driving the multi-layer piezoelectric element 1. In addition, in the present invention, various liquid fluids (conductive paste or the like) other than fuel or ink, and gases are included in the fluid.

<Fuel Injection System>

Figure 5:
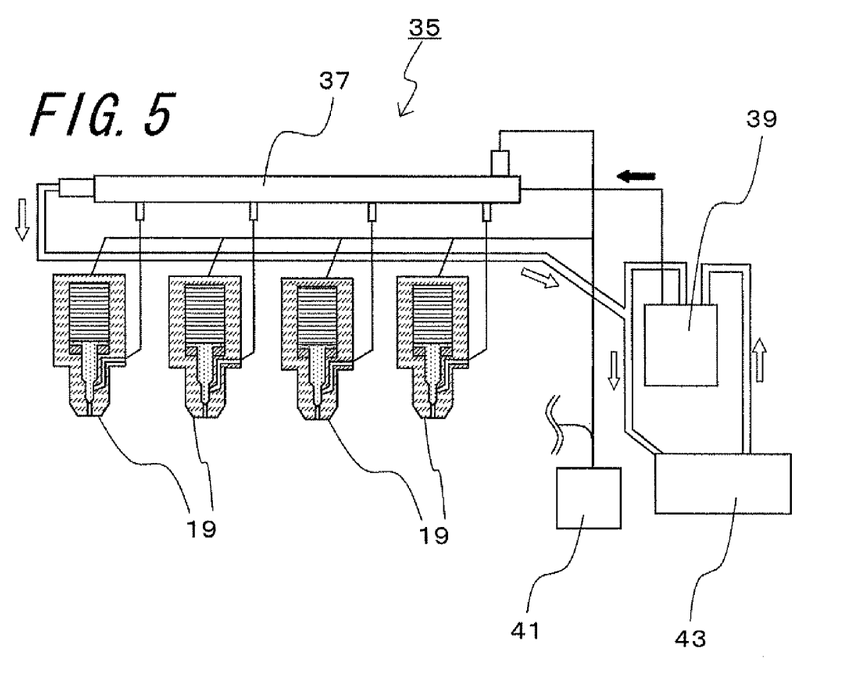
FIG. 5 is a schematic view showing an example of a fuel injection system according to an embodiment of the invention.

FIG. 5 is a schematic view showing an example of a fuel injection system according to an embodiment of the invention. As shown in FIG. 5, the fuel injection system 35 of the present embodiment includes a common rail 37 configured to store high-pressure fuel as a high-pressure fluid, a plurality of the injection devices 19 of the invention configured to inject the high-pressure fluid stored in the common rail 37, a pressure pump 39 configured to supply the high-pressure fluid to the common rail 37, and an injection control unit 41 configured to send a driving signal to the injection device 19.

The injection control unit 41 controls the amount and timing of injection of the high-pressure fluid on the basis of external information or a signal from the outside. For example, the injection control unit controls the amount and timing of fuel injection while sensing the situation of an internal combustion chamber of the engine by a sensor or the like. The pressure pump 39 plays the role to supply fuel into the common rail 37 from the fuel tank 43 at a high pressure of about 1000 to 2000 atmospheres, and preferably about 1500 to 1700 atmospheres. In the common rail 37, the high-pressure fuel sent from the pressure pump 39 is stored and appropriately fed into the injection device 19. The injection device 19 injects a predetermined amount of high-pressure fuel in the form of a mist to the outside or an adjacent container, for example, into an internal combustion chamber of an engine through the injection nozzle 21 as mentioned above.

Examples

A piezoelectric actuator including the multi-layer piezoelectric element of the invention was manufactured for trial as follows.

<Sample No. 1>

A slurry was prepared which was obtained by mixing calcined powder of piezoelectric ceramics made mainly of lead zirconate titanate (PZT) with an average particle size of 0.4 μm, a binder, and a plasticizer. A ceramic green sheet which becomes a piezoelectric layer with a thickness of about 150 μm after firing was prepared using this slurry by a doctor blade method. Next, a binder was added to a silver-palladium alloy (silver 70% by mass and palladium 30% by mass), thereby preparing a metal paste for an internal electrode layer. This metal paste was screen-printed on one side of the ceramic green sheet, and such ceramic green sheets on which the metal paste was printed were laminated as many as 300 sheets. Firing of this stacked compact was performed by maintaining the stacked compact for 200 minutes at the peak temperature of 1100° C. and then lowering temperature to the room temperature over 15 hours. The obtained sintered compact was worked with predetermined dimensions to obtain a stacked body.

<Sample No. 2>

First, a ceramic green sheet was obtained similarly to Sample No, 1. Next, two kinds of metal pastes were prepared using two kinds of metals for an internal electrode layer. One metal paste is a metal paste using an alloy of silver of 90% by mass and palladium of 10% by mass, and another metal paste is a metal paste of silver of 100%. First, the metal paste using the alloy of silver of 90% by mass and palladium of 10% by mass was screen-printed on one side of the ceramic green sheet. Next, the metal paste of silver of 100% was overlappingly screen-printed at a position which becomes an electrode end when a stacked body is obtained, such ceramic green sheets were laminated as many as 300 layers to obtain a stacked compact. Firing of this stacked compact was performed by elevating temperature over 10 hours from 650° C. to 900° C., then maintaining the stacked compact for 5 hours at 900° C., lowering temperature to 650° C. over 10 hours, and lowering temperature to 200° C. over 15 hours. The obtained sintered compact was worked with predetermined dimensions to obtain a stacked body.

Here, the stress at an interface between the internal electrode layer and the piezoelectric layer in the vicinity of the end of the internal electrode layers in the prepared stacked body can be reduced by printing the metal paste of silver of 100% at a position which becomes the end of the internal electrode layer with respect to the central portion of the internal electrode layers when being laminated. Thereby, the residual stress which is present at a particle boundary in the vicinity of the end of the internal electrode layer was reduced, and the polarization domain extending over the plurality of crystal particles was easily formed.

<Sample No. 3>

First, a ceramic green sheet was obtained similarly to Sample No. 1. Next, two kinds of metal pastes were prepared using two kinds of metals for an internal electrode layer. One metal paste is a metal paste using an alloy of silver of 90% by mass and palladium of 10% by mass, and another metal paste is a metal paste using the alloy of silver of 95% by mass and palladium of 5% by mass. The prepared metal pastes were screen-printed on one side of the ceramic green sheets, respectively. Then, when such ceramic green sheets were laminated as many as 300 layers, a stacked compact of 300 layers was obtained such that ceramic green sheets on which the metal paste using the alloy of silver of 95% by mass and palladium of 5% by mass was printed were arranged in the middle as many as 200 layers, and ceramic green sheets on which the metal paste using the alloy of silver of 90% by mass and palladium of 10% by mass was printed were arranged and laminated as many as 50 layers, respectively, on the upper and lower sides of the above sheets. Firing of this stacked compact was performed by elevating temperature over 10 hours from 550° C. to 900° C., then maintaining the stacked compact for 5 hours at 900° C., lowering temperature to 550° C. over 10 hours, and lowering temperature to 200° C. over 15 hours. The obtained sintered compact was worked with predetermined dimensions to obtain a stacked body.

Here, in the manufactured stacked body, the stress at an interface between the internal electrode layer and the piezoelectric layer can be reduced at the central portion of the stacked body by printing the metal paste of silver of 95% by mass for the internal electrode layer on the ceramic green sheet which becomes a central portion of the stacked body when being laminated. Thereby, the residual stress which is present at a particle boundary in the vicinity of the laminating central portion of the stacked body was reduced, and the polarization domain extending over the plurality of crystal particles was easily formed.

<Sample No. 4>

First, a ceramic green sheet was obtained similarly to Sample No. 1. Next, the metal paste using the alloy of silver of 95% by mass and palladium of 5% by mass was prepared for an internal electrode layer. The prepared metal paste was screen-printed on one side of the ceramic green sheet, and then a stacked compact of 300 layers was obtained. Firing of this stacked compact was performed by elevating the temperature over 10 hours from 650° C. to 900° C., then maintaining the stacked compact for 5 hours at 900° C., lowering temperature to 650° C. over 10 hours, and lowering temperature to 200° C. over 15 hours. The obtained sintered compact was worked with predetermined dimensions to obtain a stacked body.

By setting the firing peak temperature to 900° C. in this way, thereby performing firing while suppressing decomposition of lead, the composition of the piezoelectric layer is prevented from becoming uneven. Additionally, by selecting a metal with a high proportion of Ag and a low Young's modulus as the internal electrode layer, discontinuity such as crystal defects at a particle boundary, residual stress, or a hetero-phase component, was reduced, and the polarization domain extending over the plurality of crystal particles was easily formed in all of the piezoelectric layers.

An external electrode was formed on a stacked body of each of the above Sample Nos. 1 to 4. Thereafter, polarization treatment was performed on each multi-layer piezoelectric element by applying a direct-current electric field of 3 kV/mm to the external electrode for 15 minutes via a conductive member. Multi-layer piezoelectric elements serving as piezoelectric actuators were prepared in this way.

<Evaluation Method>

With respect to the obtained multi-layer piezoelectric elements, the state of a polarization domain was observed by the TEM (transmission electron microscope).

Additionally, when a direct current voltage of 170 V was applied to the obtained multi-layer piezoelectric elements, displacement in the laminate direction was obtained in all the multi-layer piezoelectric elements (piezoelectric actuators). Moreover, tests were performed in which a sinusoidal voltage of 0 to +170 V was applied to these multi-layer piezoelectric elements at a frequency of 150 Hz at room temperature, and the multi-layer piezoelectric elements were continuously driven $1 \times 10^7$ times, $1 \times 10^8$ times, and $1 \times 10^9$ times, and the amount of displacement after each test was measured. The results are shown in Table 1.

TABLE 1

| Sample No. | Polarization domain extending plurality of crystal particles | Initial amount of displacement (μm) | Amount of displacement after $1 \times 10^7$ times (μm) | Amount of displacement after $1 \times 10^8$ times (μm) | Amount of displacement after $1 \times 10^9$ times (μm) |
|---|---|---|---|---|---|
| 1 | Absent (No observed) | 24 | 18 | Stopped at $5 \times 10^7$ times | Stopped at $5 \times 10^7$ times |
| 2 | Present (Frequently observed in the vicinity of end of internal electrode layers) | 36 | 36 | 35 | 35 |
| 3 | Present (Frequently observed in some of piezoelectric layers of laminating central portion of stacked body) | 41 | 40 | 40 | 39 |

TABLE 1-continued

| Sample No. | Polarization domain extending plurality of crystal particles | Initial amount of displacement (μm) | Amount of displacement after $1 \times 10^7$ times (μm) | Amount of displacement after $1 \times 10^8$ times (μm) | Amount of displacement after $1 \times 10^9$ times (μm) |
|---|---|---|---|---|---|
| 4 | Present (Observed in all of piezoelectric layers of stacked body) | 48 | 47 | 47 | 47 |

<Evaluation Results>

As shown in Table 1, in the respective multi-layer piezoelectric elements of Sample Nos. 2 to 4 which are examples of the invention, the presence of the polarization domain extending over the plurality of crystal particles was observed in the piezoelectric layers. However, in the multi-layer piezoelectric element of Sample No. 1 which is a comparative example of the invention, the presence of the polarization domain extending over the plurality of crystal particles could not observed in the piezoelectric layers.

In addition, in the multi-layer piezoelectric element of Sample No. 2 which is an example of the invention, the presence of the polarization domain extending over the plurality of crystal particles could be confirmed in the parts in the vicinity of the ends of all of the internal electrode layers.

Additionally, in the multi-layer piezoelectric element of Sample No. 3 which is an example of the invention, the presence of the polarization domain extending over a plurality of crystal particles could be confirmed in some of the piezoelectric layers at the laminating central portion of the stacked body.

Moreover, in the multi-layer piezoelectric element of Sample No. 4 which is an example of the invention, the presence of the polarization domain extending over a plurality of crystal particles could be confirmed in all of the piezoelectric layers.

Furthermore, it was confirmed that the average particle size of the plurality of crystal particles of the piezoelectric layers of the multi-layer piezoelectric element of Sample No. 1 which is a comparative example was 6 μm, and cracks were frequently generated in the piezoelectric layer which is porcelain after continuous driving, whereas in the multi-layer piezoelectric elements of Sample Nos. 2 to 4 which are examples of the invention, the average particle size of the plurality of crystal particles of the piezoelectric layer was 2 to 3 μm, and few small cracks were only observed, and durability was also excellent even after continuous driving.

In the multi-layer piezoelectric element of Sample No. 1, the initial amount of displacement was 24 μm, while the amount of displacement after $1 \times 10^7$ times decreased to 18 μm, and cracks were frequently generated, and the measurement was stopped in the piezoelectric layer after $5 \times 10^7$ times.

On the other hand, in the multi-layer piezoelectric element of Sample No. 2, the initial amount of displacement was 36 μm, while the amount of displacement after $1 \times 10^7$ times was 36 μm, the amount of displacement after $1 \times 10^8$ times was 35 μm, and the amount of displacement after $1 \times 10^9$ times was 35 μm. Additionally, in the multi-layer piezoelectric element of Sample No. 3, the initial amount of displacement was 41 μm, while the amount of displacement after $1 \times 10^7$ times was 40 μm, the amount of displacement after $1 \times 10^8$ times was 40 μm, and the amount of displacement after $1 \times 10^9$ times was 39 μm. Additionally, in the multi-layer piezoelectric element of Sample No. 4, the initial amount of displacement was 48 μm, while the amount of displacement after $1 \times 10^7$ times was 47 μm, the amount of displacement after $1 \times 10^8$ times was 47 μm, and the amount of displacement after $1 \times 10^9$ times was also 47 μm. It can be seen from these results that, according to the multi-layer piezoelectric elements of the invention, a large amount of displacement is given, the performance of the elements does not deteriorate greatly even after continuous driving of $1 \times 10^9$ times, and prolonged durability is excellent.

Especially, in the multi-layer piezoelectric element of Sample No. 4, an extremely large amount of displacement is given, the performance of the element hardly changed even after continuous driving, the amount of displacement of the element is remarkably stable, and durability is also excellent.

| Reference Signs List | |
|---|---|
| 1: | Multi-layer piezoelectric element |
| 3: | Piezoelectric layer |
| 5: | Internal electrode layer |
| 7: | Stacked body |
| 9: | External electrode |
| 11: | Crystal particles |
| 12: | Polarization domain |
| 19: | Injection device |
| 21: | Injection nozzle |
| 23: | Housing container (Container) |
| 25: | Needle valve |
| 27: | Fluid passage |
| 29: | Cylinder |
| 31: | Piston |
| 33: | Dish spring |
| 35: | Fuel injection system |
| 37: | Common rail |
| 39: | Pressure pump |
| 41: | Injection control unit |
| 43: | Fuel tank |

The invention claimed is:

1. A multi-layer piezoelectric element, comprising:
    a stacked body in which piezoelectric layers and internal electrode layers are alternately laminated, wherein
    the piezoelectric layers comprise a polarization domain extending over a plurality of crystal particles.

2. The multi-layer piezoelectric element according to claim 1, wherein the polarization domain extends over the plurality of crystal particles with the plurality of crystal particles located therein.

3. The multi-layer piezoelectric element according to claim 1, wherein a direction of spontaneous polarization of the polarization domain is deviated from an electric field direction of a voltage applied between the internal electrode layers.

4. The multi-layer piezoelectric element according to claim 1, wherein an average particle size of the plurality of crystal particles of the piezoelectric layers is 5 μm or less.

5. The multi-layer piezoelectric element according to claim 1, wherein the polarization domain of the piezoelectric layers is located in a vicinity of an end of the internal electrode layers.

6. The multi-layer piezoelectric element according to claim 1, wherein the polarization domain is formed in some of the piezoelectric layers.

7. The multi-layer piezoelectric element according to claim 1, wherein the polarization domain is formed in all of the piezoelectric layers.

8. An injection device, comprising:
- a container comprising an injection nozzle; and
- the multi-layer piezoelectric element according to claim 1, wherein
- a liquid stored in the container is configured to be injected through the injection nozzle by driving the multi-layer piezoelectric element.

9. A fuel injection system, comprising:
- a common rail configured to store high-pressure fuel;
- the injection device according to claim 8 configured to inject the high-pressure fuel stored in the common rail;
- a pressure pump configured to supply the high-pressure fuel to the common rail; and
- an injection control unit configured to send a driving signal to the injection device.

* * * * *